US009921972B2

(12) United States Patent
Wilkerson et al.

(10) Patent No.: US 9,921,972 B2
(45) Date of Patent: *Mar. 20, 2018

(54) METHOD AND APPARATUS FOR IMPLEMENTING A HETEROGENEOUS MEMORY SUBSYSTEM

(71) Applicant: Intel Corporation, Santa Clara, CA (US)

(72) Inventors: Christopher B. Wilkerson, Portland, OR (US); Alaa R. Alameldeen, Hillsboro, OR (US); Zeshan A. Chishti, Hillsboro, OR (US); Jaewoong Sim, Atlanta, GA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/281,383

(22) Filed: Sep. 30, 2016

(65) Prior Publication Data

US 2017/0017580 A1 Jan. 19, 2017

Related U.S. Application Data

(63) Continuation of application No. 14/228,856, filed on Mar. 28, 2014, now Pat. No. 9,472,248.

(51) Int. Cl.
*G06F 12/00* (2006.01)
*G06F 12/122* (2016.01)
(Continued)

(52) U.S. Cl.
CPC ............ *G06F 12/122* (2013.01); *G06F 3/06* (2013.01); *G06F 3/061* (2013.01); *G06F 3/0644* (2013.01);
(Continued)

(58) Field of Classification Search
CPC ............ G06F 11/1068; G06F 12/0862; G06F 2212/6024; G06F 3/06; G06F 3/061;
(Continued)

(56) References Cited

U.S. PATENT DOCUMENTS 6,134,643 A * 10/2000 Kedem ............... G06F 12/0862
711/137
9,195,579 B2 * 11/2015 Kwon ................. G06F 12/0238
(Continued)

OTHER PUBLICATIONS

Dong, X., et al., "Simple but Effective Heterogeneous Main Memory with On-Chip Memory Controller Support," in SC, IEEE, Nov. 2010, 11 pages.
(Continued)

*Primary Examiner* — Zhuo Li
(74) *Attorney, Agent, or Firm* — Nicholson De Vos Webster & Elliott LLP

(57) ABSTRACT

An apparatus and method for implementing a heterogeneous memory subsystem is described. For example, one embodiment of a processor comprises: memory mapping logic to subdivide a system memory space into a plurality of memory chunks and to map the memory chunks across a first memory and a second memory, the first memory having a first set of memory access characteristics and the second memory having a second set of memory access characteristics different from the first set of memory access characteristics; and dynamic remapping logic to swap memory chunks between the first and second memories based, at least in part, on a detected frequency with which the memory chunks are accessed.

19 Claims, 19 Drawing Sheets

(51) Int. Cl.
     *G11C 7/10*      (2006.01)
     *G06F 3/06*      (2006.01)
     *G06F 12/0893*   (2016.01)
(52) U.S. Cl.
     CPC .......... *G06F 3/0647* (2013.01); *G06F 3/0673* (2013.01); *G06F 12/0893* (2013.01); *G11C 7/1072* (2013.01); *G06F 2212/1016* (2013.01)
(58) Field of Classification Search
     CPC .... G06F 3/0617; G06F 3/0653; G06F 3/0688; G11C 29/52; G11C 7/1072
     See application file for complete search history.

(56)                References Cited

U.S. PATENT DOCUMENTS

| 2010/0077136 A1* | 3/2010 | Ware ................... G06F 12/0246 711/103 |
| 2011/0252180 A1* | 10/2011 | Hendry ................. G06F 1/3203 711/3 |
| 2014/0075137 A1* | 3/2014 | Shin ........................ G06F 12/08 711/159 |

OTHER PUBLICATIONS

Ekman, M., et al., "A Cost-Effective Main Memory Organization for Future Servers," in Proceedings of the 19$^{th}$ IEEE International Parallel and Distributed Processing Symposium (*IPDPS '05*), 10 pages.

Eyerman, S., et al., "System-Level Performance Metrics for Multiprogram Workloads," IEEE Computer Society, May-Jun. 2008 pp. 42-53.

Falsafi, B., et al., "Reactive NUMA: A Design for Unifying S-COMA and CC-NUMA," in *ISCA-24*, 199, 12 pages.

Hagersten, E., et al., "Simple COMA Node Implementations," in Proceedings of the Twenty-Seventh Annual HICSS-27, IEEE,1994, pp. 522-533.

HPArch, "Macsim simulator for heterogeneous architecture," http://code.google.com/p/macsim/, 1 page, [printed on Mar. 13, 2014].

Huang, H., et al, "Design and Implementation of Power-Aware Virtual Memory," in *USENIX ATEC* '03, 2003, pp. 56-70.

JEDEC, "Wide I/O Single Data Rate (Wide I/O SDR)," http://www.jedec.org/standards-documents/docs/jesd229, 4 pages, [printed on Mar. 13, 2014].

Jevdjic, D., et al., "Die-stacked DRAM caches for servers: Hit Ratio, Latency, or Bandwidth? Have it all with footprint cache," in *ISCA-40*, 2013, pp. 1-12.

Jiang, X., et al. "CHOP: Adaptive Filter-Based DRAM Caching for CMP Server Platforms," in *HPCA-16*, 2009, 12 pages.

Kalla, R., et al., "Power7: IBM's Next-Generation Server Processor," *IEEE Micro*, vol. 30, No. 2, Mar. 2010, pp. 7-15.

Laudon, J., et al., "The SGI Origin: A ccNUMA Highly Scalable Server," in *ISCA-24*, 1997, pp. 241-251.

Lee, D., et al., "LRFU: A Spectrum of Policies that Subsumes the Least Recently Used and Least Frequently Used Policies," *IEEE Transactions on Computers*, vol. 50, No. 12, Dec. 2001, pp. 1352-1361.

Lee, D., et al., "Tiered-latency DRAM: A Low Latency and Low Cost DRAM Architecture," in *HPCA-19*, 2013, pp. 1-12.

Loh, G. H., et al., "Efficiently Enabling Conventional Block Sizes for Very Large Die-Stacked DRAM Caches," in *MICRO-44*, Dec. 3-7, 2011, 11 pages.

Loh, G. H., et al., "Challenges in Heterogeneous Die-Stacked and Off-Chip Memory Systems," in *SHAW*-3, 2012, pp. 1-6.

Qureshi, M. K., et al., "Fundamental Latency Trade-offs in Architecting DRAM Caches," in *MICRO-45*, 2012, 12 pages.

Ramos, L. E., et al., "Page Placement in Hybrid Memory Systems," in *ICS '11*, May 31-Jun. 4, 2011, 11 pages.

Sherwood, T., et al., "Automatically Characterizing Large Scale Program Behavior," in *ASPLOS-X*, 2002, pp. 45-57.

Sim, J., et al., "A Mostly-Clean DRAM Cache for Effective Hit Speculation and Self-Balancing Dispatch," in 2012 IEEE/ACM 45the Annual International Symposium on Microarchitecture, *MICRO-45*, 2012, pp. 247-257.

Sim, J., et al. "Resilient Die-stacked DRAM Caches," in *ISCA-40*, 2013, 12 pages.

Snavely, A., et al., "Symbiotic Jobscheduling for a Simultaneous Multithreading Processor," in *ASPLOS-IX*, 2000, 11 pages.

Sudan, K., et al., "Micro-Pages: Increasing DRAM Efficiency with Locality-Aware Data Placement," in *ASPLOX-XV*, Mar. 13-17, 2010, 12 pages.

Ekman, M., et al., "A Cost-Effective Main Memory Organization for Future Servers," in Proceedings of the 19th IEEE International Parallel and Distributed Processing Symposium (IPDPS '05), 10 pages.

HPArch, "Macsim simulator for heterogeneous architecture, " http://code.google.com/p/macsim/, 1 page, [printed on Mar. 13, 2014].

JEDEC, "Wide I/O Single Data Rate (Wide I/O SDR)," http://www.jedec.or/standardsdocuments/docs/jesd229, 4 pages, [printed on Mar. 13, 2014].

Office Action from U.S. Appl. No. 14/228,856, dated Feb. 1, 2016, 9 pages.

Notice of Allowance from U.S. Appl. No. 14/228,856, dated Jun. 29, 2016, 7 pages.

\* cited by examiner

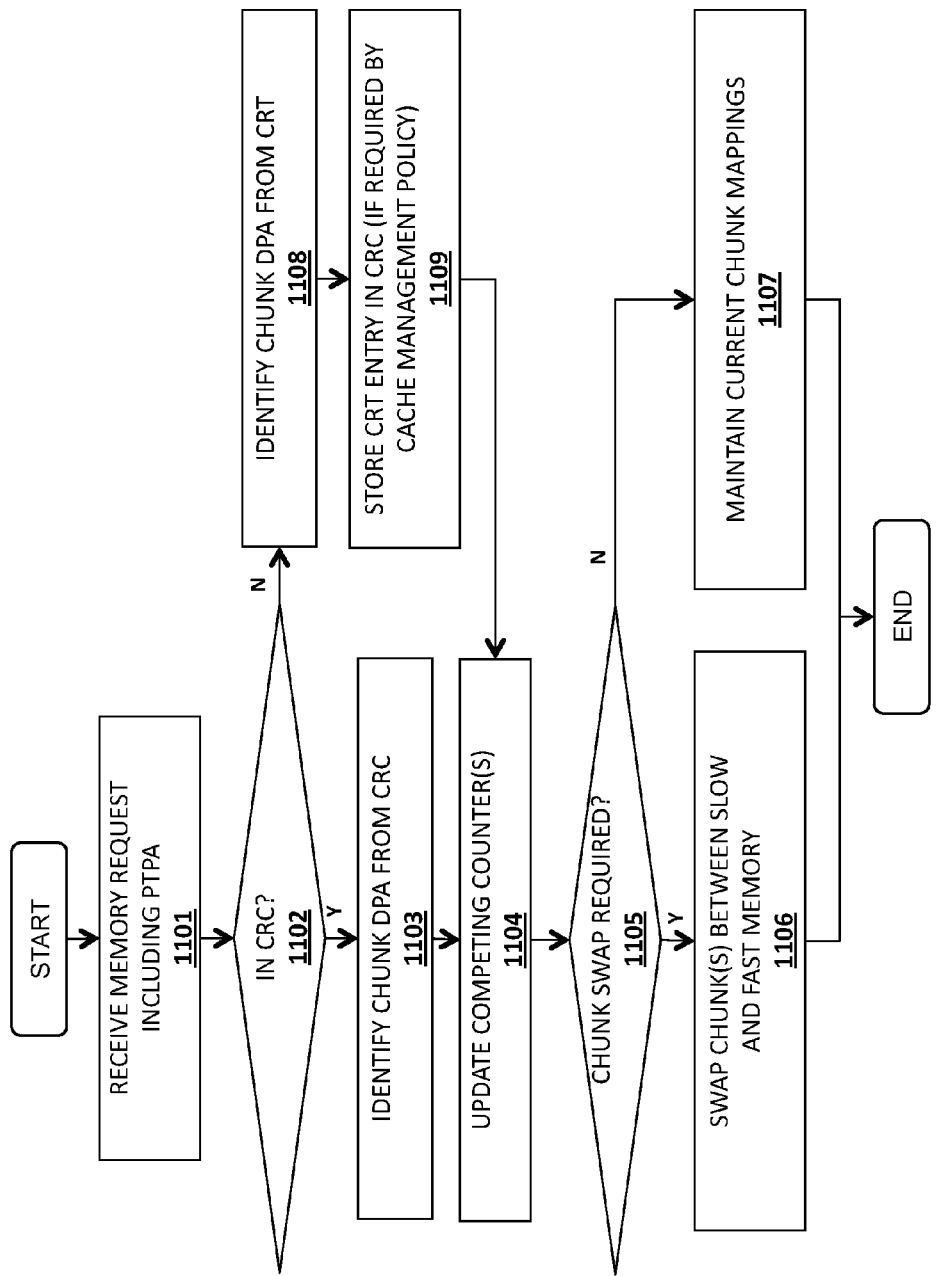

METHOD AND APPARATUS FOR IMPLEMENTING A HETEROGENEOUS MEMORY SUBSYSTEM

CROSS REFERENCE TO RELATED APPLICATION

This application is a continuation of co-pending U.S. patent application Ser. No. 14/228,856, filed Mar. 28, 2014, entitled "Method And Apparatus For Implementing A Heterogeneous Memory Subsystem", which is herein incorporated by reference.

BACKGROUND

Field of the Invention

This invention relates generally to the field of computer processors. More particularly, the invention relates to an apparatus and method for implementing a heterogeneous memory subsystem.

Description of the Related Art

Recent technology advancements allow for the integration of large memory structures on-die or as a die-stacked dynamic random access memory (DRAM). Such structures are much faster to access than off-die memory. Prior work has investigated using these large structures as a cache, or as part of a heterogeneous memory system, sometimes referred to as a non-uniform memory architecture (NUMA), under management of the operating system (OS).

Using this memory as a cache would waste a significant fraction of total memory space, especially for mobile systems where stacked memory may be as large as off-die memory. An OS-managed NUMA system, on the other hand, requires usage monitoring hardware to migrate frequently-used pages, and is often unable to capture pages that are highly utilized for short periods of time.

BRIEF DESCRIPTION OF THE DRAWINGS

A better understanding of the present invention can be obtained from the following detailed description in conjunction with the following drawings, in which:

FIG. 15 illustrates one embodiment of a method for implementing a heterogeneous memory subsystem.

DETAILED DESCRIPTION

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Exemplary Processor Architectures and Data Types

Figure 1:
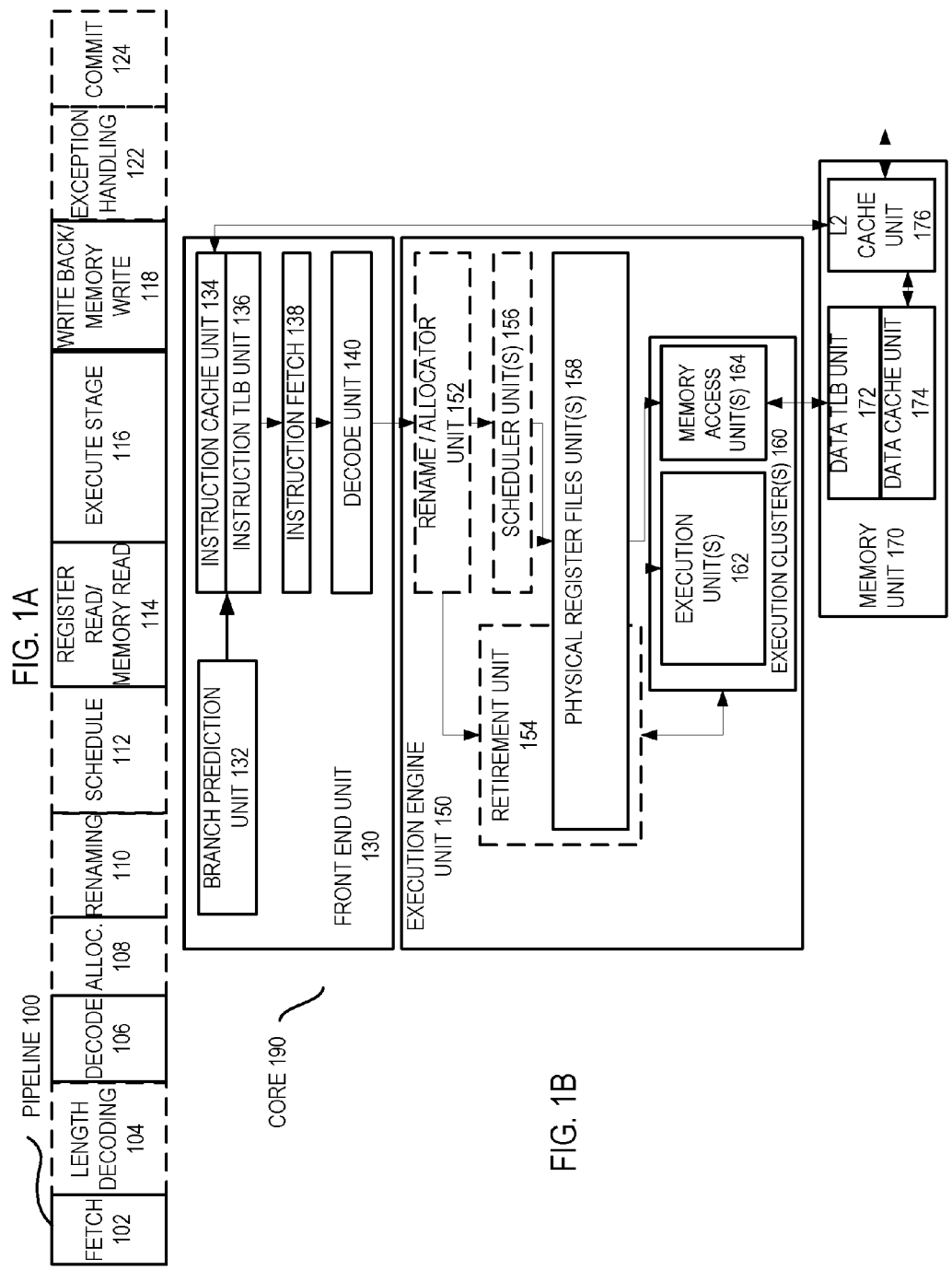
FIG. 1A is a block diagram illustrating both an exemplary in-order pipeline and an exemplary register renaming, out-of-order issue/execution pipeline according to embodiments of the invention.
FIG. 1B is a block diagram illustrating both an exemplary embodiment of an in-order architecture core and an exemplary register renaming, out-of-order issue/execution architecture core to be included in a processor according to embodiments of the invention.

FIG. 1A is a block diagram illustrating both an exemplary in-order pipeline and an exemplary register renaming, out-of-order issue/execution pipeline according to embodiments of the invention. FIG. 1B is a block diagram illustrating both an exemplary embodiment of an in-order architecture core and an exemplary register renaming, out-of-order issue/execution architecture core to be included in a processor according to embodiments of the invention. The solid lined boxes in FIGS. 1A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 1A, a processor pipeline 100 includes a fetch stage 102, a length decode stage 104, a decode stage 106, an allocation stage 108, a renaming stage 110, a scheduling (also known as a dispatch or issue) stage 112, a register read/memory read stage 114, an execute stage 116, a write back/memory write stage 118, an exception handling stage 122, and a commit stage 124.

FIG. 1B shows processor core 190 including a front end unit 130 coupled to an execution engine unit 150, and both are coupled to a memory unit 170. The core 190 may be a reduced instruction set computing (RISC) core, a complex instruction set computing (CISC) core, a very long instruction word (VLIW) core, or a hybrid or alternative core type. As yet another option, the core 190 may be a special-purpose core, such as, for example, a network or communication core, compression engine, coprocessor core, general purpose computing graphics processing unit (GPGPU) core, graphics core, or the like.

The front end unit 130 includes a branch prediction unit 132 coupled to an instruction cache unit 134, which is coupled to an instruction translation lookaside buffer (TLB) 136, which is coupled to an instruction fetch unit 138, which is coupled to a decode unit 140. The decode unit 140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 190 includes a microcode ROM or other medium that stores microcode for certain macroinstructions (e.g., in decode unit 140 or otherwise within the front end unit 130). The decode unit 140 is coupled to a rename/allocator unit 152 in the execution engine unit 150.

The execution engine unit 150 includes the rename/allocator unit 152 coupled to a retirement unit 154 and a set of one or more scheduler unit(s) 156. The scheduler unit(s) 156 represents any number of different schedulers, including reservations stations, central instruction window, etc. The scheduler unit(s) 156 is coupled to the physical register file(s) unit(s) 158. Each of the physical register file(s) units 158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 158 comprises a vector registers unit, a write mask registers unit, and a scalar registers unit. These register units may provide architectural vector registers, vector mask registers, and general purpose registers. The physical register file(s) unit(s) 158 is overlapped by the retirement unit 154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 154 and the physical register file(s) unit(s) 158 are coupled to the execution cluster(s) 160. The execution cluster(s) 160 includes a set of one or more execution units 162 and a set of one or more memory access units 164. The execution units 162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 156, physical register file(s) unit(s) 158, and execution cluster(s) 160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 164). It should also be understood that where separate pipelines are used, one or more of these pipelines may be out-of-order issue/execution and the rest in-order.

The set of memory access units 164 is coupled to the memory unit 170, which includes a data TLB unit 172 coupled to a data cache unit 174 coupled to a level 2 (L2) cache unit 176. In one exemplary embodiment, the memory access units 164 may include a load unit, a store address unit, and a store data unit, each of which is coupled to the data TLB unit 172 in the memory unit 170. The instruction cache unit 134 is further coupled to a level 2 (L2) cache unit 176 in the memory unit 170. The L2 cache unit 176 is coupled to one or more other levels of cache and eventually to a main memory.

By way of example, the exemplary register renaming, out-of-order issue/execution core architecture may implement the pipeline 100 as follows: 1) the instruction fetch 138 performs the fetch and length decoding stages 102 and 104; 2) the decode unit 140 performs the decode stage 106; 3) the rename/allocator unit 152 performs the allocation stage 108 and renaming stage 110; 4) the scheduler unit(s) 156 performs the schedule stage 112; 5) the physical register file(s) unit(s) 158 and the memory unit 170 perform the register read/memory read stage 114; the execution cluster 160 perform the execute stage 116; 6) the memory unit 170 and the physical register file(s) unit(s) 158 perform the write back/memory write stage 118; 7) various units may be involved in the exception handling stage 122; and 8) the retirement unit 154 and the physical register file(s) unit(s) 158 perform the commit stage 124.

The core 190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 190 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 134/174 and a shared L2 cache unit 176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 2:
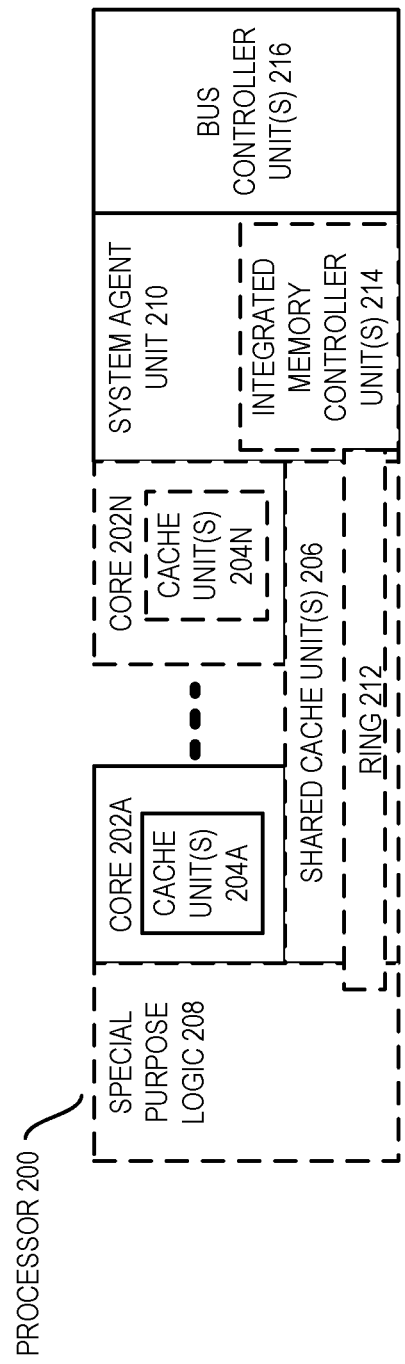
FIG. 2 is a block diagram of a single core processor and a multicore processor with integrated memory controller and graphics according to embodiments of the invention.

FIG. 2 is a block diagram of a processor 200 that may have more than one core, may have an integrated memory controller, and may have integrated graphics according to embodiments of the invention. The solid lined boxes in FIG. 2 illustrate a processor 200 with a single core 202A, a system agent 210, a set of one or more bus controller units 216, while the optional addition of the dashed lined boxes illustrates an alternative processor 200 with multiple cores 202A-N, a set of one or more integrated memory controller unit(s) 214 in the system agent unit 210, and special purpose logic 208.

Thus, different implementations of the processor 200 may include: 1) a CPU with the special purpose logic 208 being integrated graphics and/or scientific (throughput) logic (which may include one or more cores), and the cores 202A-N being one or more general purpose cores (e.g., general purpose in-order cores, general purpose out-of-order cores, a combination of the two); 2) a coprocessor with the cores 202A-N being a large number of special purpose cores intended primarily for graphics and/or scientific (throughput); and 3) a coprocessor with the cores 202A-N being a large number of general purpose in-order cores. Thus, the processor 200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 206, and external memory (not shown) coupled to the set of integrated memory controller units 214. The set of shared cache units 206 may include one or more mid-level caches, such as level 2 (L2), level 3 (L3), level 4 (L4), or other levels of cache, a last level cache (LLC), and/or combinations thereof. While in one embodiment a ring based interconnect unit 212 interconnects the integrated graphics logic 208, the set of shared cache units 206, and the system agent unit 210/integrated memory controller unit(s) 214, alternative embodiments may use any number of well-known techniques for interconnecting such units. In one embodiment, coherency is maintained between one or more cache units 206 and cores 202-A-N.

In some embodiments, one or more of the cores 202A-N are capable of multi-threading. The system agent 210 includes those components coordinating and operating cores 202A-N. The system agent unit 210 may include for example a power control unit (PCU) and a display unit. The PCU may be or include logic and components needed for regulating the power state of the cores 202A-N and the integrated graphics logic 208. The display unit is for driving one or more externally connected displays.

The cores 202A-N may be homogenous or heterogeneous in terms of architecture instruction set; that is, two or more of the cores 202A-N may be capable of execution the same instruction set, while others may be capable of executing only a subset of that instruction set or a different instruction set. In one embodiment, the cores 202A-N are heterogeneous and include both the "small" cores and "big" cores described below.

FIGS. 3-6 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 3:
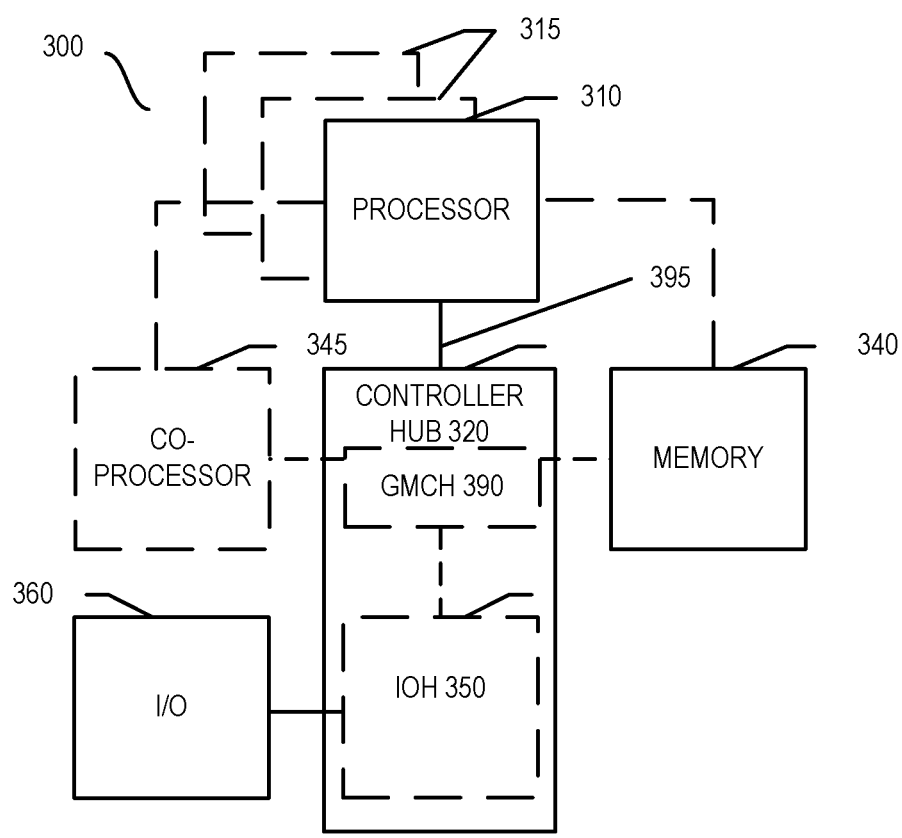
FIG. 3 illustrates a block diagram of a system in accordance with one embodiment of the present invention.

Referring now to FIG. 3, shown is a block diagram of a system 300 in accordance with one embodiment of the present invention. The system 300 may include one or more processors 310, 315, which are coupled to a controller hub 320. In one embodiment the controller hub 320 includes a graphics memory controller hub (GMCH) 390 and an Input/Output Hub (IOH) 350 (which may be on separate chips); the GMCH 390 includes memory and graphics controllers to which are coupled memory 340 and a coprocessor 345; the IOH 350 is couples input/output (I/O) devices 360 to the GMCH 390. Alternatively, one or both of the memory and graphics controllers are integrated within the processor (as described herein), the memory 340 and the coprocessor 345 are coupled directly to the processor 310, and the controller hub 320 in a single chip with the IOH 350.

The optional nature of additional processors 315 is denoted in FIG. 3 with broken lines. Each processor 310, 315 may include one or more of the processing cores described herein and may be some version of the processor 200.

The memory 340 may be, for example, dynamic random access memory (DRAM), phase change memory (PCM), or a combination of the two. For at least one embodiment, the controller hub 320 communicates with the processor(s) 310, 315 via a multi-drop bus, such as a frontside bus (FSB), point-to-point interface such as QuickPath Interconnect (QPI), or similar connection 395.

In one embodiment, the coprocessor 345 is a special-purpose processor, such as, for example, a high-throughput MIC processor, a network or communication processor, compression engine, graphics processor, GPGPU, embedded processor, or the like. In one embodiment, controller hub 320 may include an integrated graphics accelerator.

There can be a variety of differences between the physical resources 310, 315 in terms of a spectrum of metrics of merit including architectural, microarchitectural, thermal, power consumption characteristics, and the like.

In one embodiment, the processor 310 executes instructions that control data processing operations of a general type. Embedded within the instructions may be coprocessor instructions. The processor 310 recognizes these coprocessor instructions as being of a type that should be executed by the attached coprocessor 345. Accordingly, the processor 310 issues these coprocessor instructions (or control signals representing coprocessor instructions) on a coprocessor bus or other interconnect, to coprocessor 345. Coprocessor(s) 345 accept and execute the received coprocessor instructions.

Figure 4:
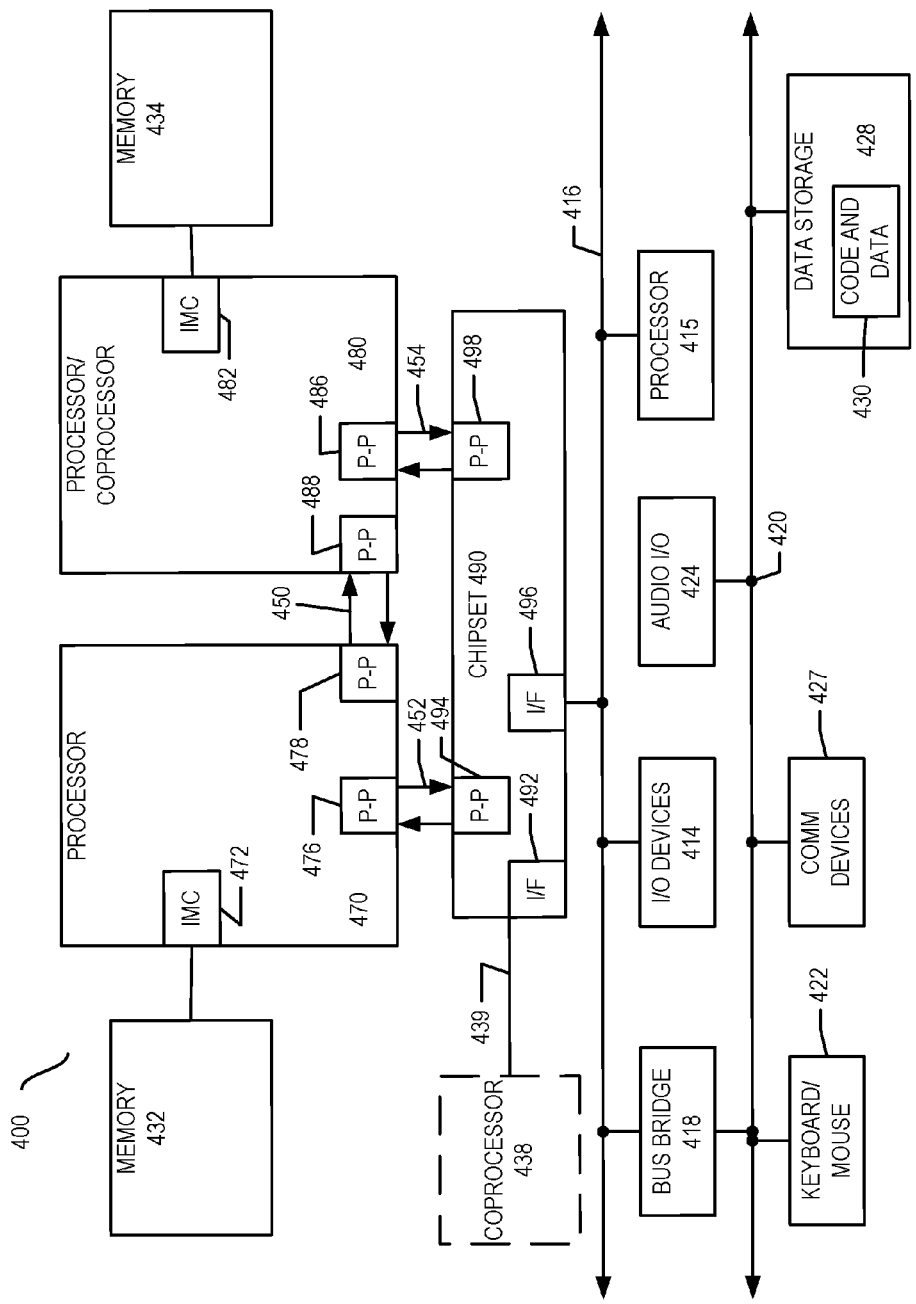
FIG. 4 illustrates a block diagram of a second system in accordance with an embodiment of the present invention.

Referring now to FIG. 4, shown is a block diagram of a first more specific exemplary system 400 in accordance with an embodiment of the present invention. As shown in FIG. 4, multiprocessor system 400 is a point-to-point interconnect system, and includes a first processor 470 and a second processor 480 coupled via a point-to-point interconnect 450. Each of processors 470 and 480 may be some version of the processor 200. In one embodiment of the invention, processors 470 and 480 are respectively processors 310 and 315, while coprocessor 438 is coprocessor 345. In another embodiment, processors 470 and 480 are respectively processor 310 coprocessor 345.

Processors 470 and 480 are shown including integrated memory controller (IMC) units 472 and 482, respectively. Processor 470 also includes as part of its bus controller units point-to-point (P-P) interfaces 476 and 478; similarly, second processor 480 includes P-P interfaces 486 and 488. Processors 470, 480 may exchange information via a point-to-point (P-P) interface 450 using P-P interface circuits 478, 488. As shown in FIG. 4, IMCs 472 and 482 couple the processors to respective memories, namely a memory 432 and a memory 434, which may be portions of main memory locally attached to the respective processors.

Processors 470, 480 may each exchange information with a chipset 490 via individual P-P interfaces 452, 454 using point to point interface circuits 476, 494, 486, 498. Chipset 490 may optionally exchange information with the coprocessor 438 via a high-performance interface 439. In one embodiment, the coprocessor 438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 490 may be coupled to a first bus 416 via an interface 496. In one embodiment, first bus 416 may be a Peripheral Component Interconnect (PCI) bus, or a bus such as a PCI Express bus or another third generation I/O interconnect bus, although the scope of the present invention is not so limited.

As shown in FIG. 4, various I/O devices 414 may be coupled to first bus 416, along with a bus bridge 418 which couples first bus 416 to a second bus 420. In one embodiment, one or more additional processor(s) 415, such as coprocessors, high-throughput MIC processors, GPGPU's, accelerators (such as, e.g., graphics accelerators or digital signal processing (DSP) units), field programmable gate arrays, or any other processor, are coupled to first bus 416. In one embodiment, second bus 420 may be a low pin count (LPC) bus. Various devices may be coupled to a second bus 420 including, for example, a keyboard and/or mouse 422, communication devices 427 and a storage unit 428 such as a disk drive or other mass storage device which may include instructions/code and data 430, in one embodiment. Further, an audio I/O 424 may be coupled to the second bus 420. Note that other architectures are possible. For example, instead of the point-to-point architecture of FIG. 4, a system may implement a multi-drop bus or other such architecture.

Figure 5:
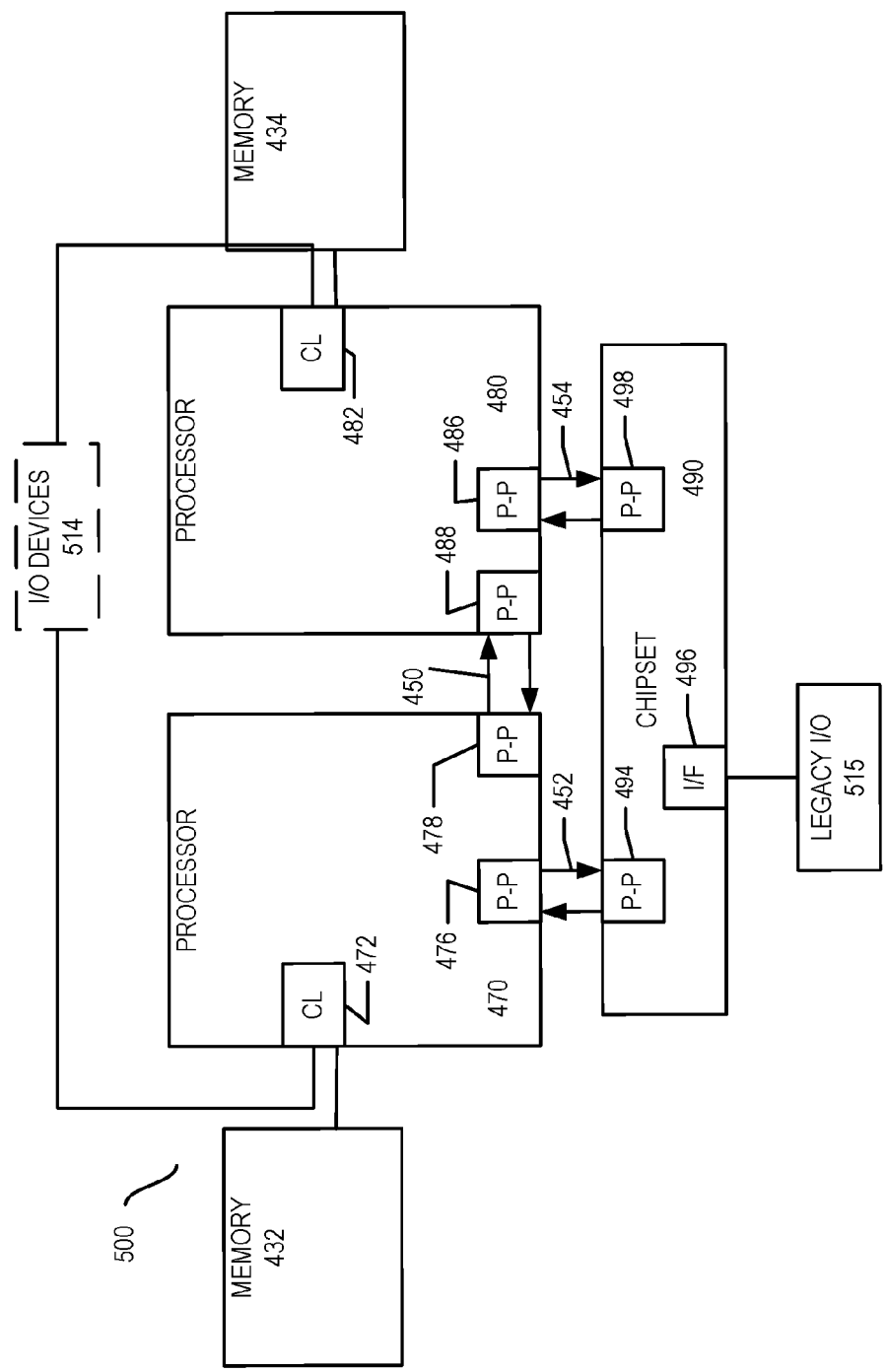
FIG. 5 illustrates a block diagram of a third system in accordance with an embodiment of the present invention.

Referring now to FIG. 5, shown is a block diagram of a second more specific exemplary system 500 in accordance with an embodiment of the present invention. Like elements in FIGS. 4 and 5 bear like reference numerals, and certain aspects of FIG. 4 have been omitted from FIG. 5 in order to avoid obscuring other aspects of FIG. 5.

FIG. 5 illustrates that the processors 470, 480 may include integrated memory and I/O control logic ("CL") 472 and 482, respectively. Thus, the CL 472, 482 include integrated memory controller units and include I/O control logic. FIG. 5 illustrates that not only are the memories 432, 434 coupled to the CL 472, 482, but also that I/O devices 514 are also coupled to the control logic 472, 482. Legacy I/O devices 515 are coupled to the chipset 490.

Figure 6:
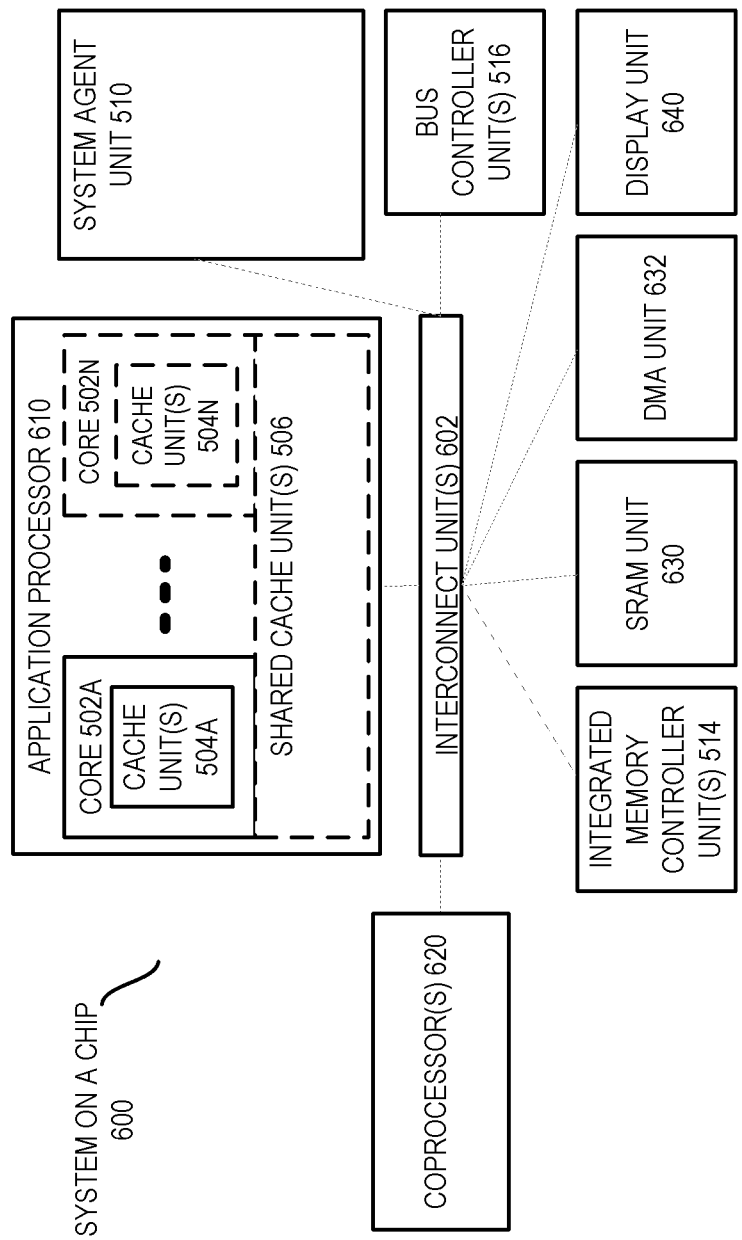
FIG. 6 illustrates a block diagram of a system on a chip (SoC) in accordance with an embodiment of the present invention.

Referring now to FIG. 6, shown is a block diagram of a SoC 600 in accordance with an embodiment of the present invention. Similar elements in FIG. 2 bear like reference numerals. Also, dashed lined boxes are optional features on more advanced SoCs. In FIG. 6, an interconnect unit(s) 602 is coupled to: an application processor 610 which includes a set of one or more cores 202A-N and shared cache unit(s) 206; a system agent unit 210; a bus controller unit(s) 216; an integrated memory controller unit(s) 214; a set or one or more coprocessors 620 which may include integrated graphics logic, an image processor, an audio processor, and a video processor; an static random access memory (SRAM) unit 630; a direct memory access (DMA) unit 632; and a display unit 640 for coupling to one or more external displays. In one embodiment, the coprocessor(s) 620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 430 illustrated in FIG. 4, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 7:
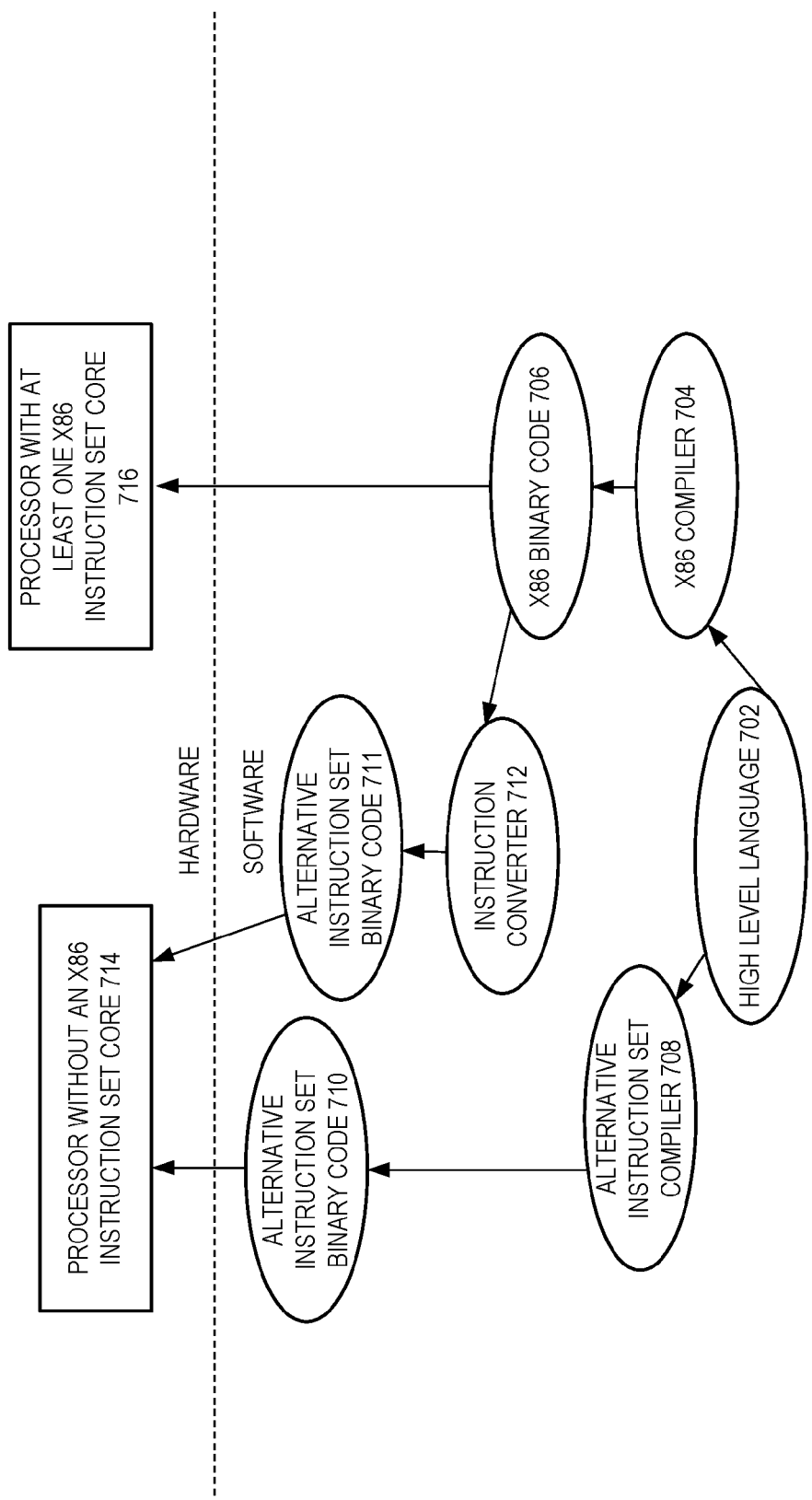
FIG. 7 illustrates a block diagram contrasting the use of a software instruction converter to convert binary instructions in a source instruction set to binary instructions in a target instruction set according to embodiments of the invention.

FIG. 7 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 7 shows a program in a high level language 702 may be compiled using an x86 compiler 704 to generate x86 binary code 706 that may be natively executed by a processor with at least one x86 instruction set core 716. The processor with at least one x86 instruction set core 716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 704 represents a compiler that is operable to generate x86 binary code 706 (e.g., object code) that can, with or without additional linkage processing, be executed on the processor with at least one x86 instruction set core 716. Similarly, FIG. 7 shows the program in the high level language 702 may be compiled using an alternative instruction set compiler 708 to generate alternative instruction set binary code 710 that may be natively executed by a processor without at least one x86 instruction set core 714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 712 is used to convert the x86 binary code 706 into code that may be natively executed by the processor without an x86 instruction set core 714. This converted code is not likely to be the same as the alternative instruction set binary code 710 because an instruction converter capable of this is difficult to make; however, the converted code will accomplish the general operation and be made up of instructions from the alternative instruction set. Thus, the instruction converter 712 represents software, firmware, hardware, or a combination thereof that, through emulation, simulation or any other process, allows a processor or other electronic device that does not have an x86 instruction set processor or core to execute the x86 binary code 706.

Apparatus and Method for Implementing a Heterogeneous Memory Subsystem

A "heterogeneous memory system" is a memory subsystem in which some portions of memory can be accessed faster (typically located on-chip) than other portions of memory (typically located off-chip). Many future memory systems will exploit such heterogeneity to meet a variety of requirements imposed on today's memory architectures. One example is a memory subsystem composed of stacked DRAM and off-chip memory, where DRAM stacked on the processor provides both higher bandwidth and faster access time as compared to the off-chip memory. Another example is the recently proposed tiered-latency DRAM architecture, where a DRAM array is broken up into near and far chunks that have fast and slow access times, respectively. Such heterogeneous memory is often equipped with hundreds of megabytes (or even a few gigabytes) of fast memory, so a key to achieving greater performance is how to make an efficient use of such large, fast memory.

Heterogeneous memory can be managed in a number of ways but the most common approach is to manage it as a cache. Generally, in this approach, allocating a block in the fast memory entails the duplication of the slow memory block into the fast memory. Although such duplication results in capacity loss, it makes block allocations simple and fast. However, in cases where the capacity of the fast memory is comparable to that of the slow memory, the capacity lost in duplication may be unacceptable. In these cases, both fast and slow memory may be combined into a single flat address space, referred to herein as a Part-of-Memory (PoM) Architecture. The simplest PoM architecture resembles a typical homogeneous memory architecture, with a portion of the address space mapped statically to the fast memory with the remainder mapped to the slow memory. To maximize the performance benefits of fast memory, the operating system (OS) may allocate heavily used pages to the portion of the physical address space mapped to the fast memory.

The embodiments of the invention described below provide an architectural solution to efficiently using a large, fast memory as a PoM seamlessly, without the involvement of the OS. The described architecture effectively manages two different types of memory (slow and fast) combined to create a single physical address space. To achieve this, regions of memory may be dynamically remapped based on their access patterns and expected performance benefit. The described architecture improves performance by 18.4% and 10.5% over static mapping and an ideal OS-based migration, respectively.

Figure 8A:
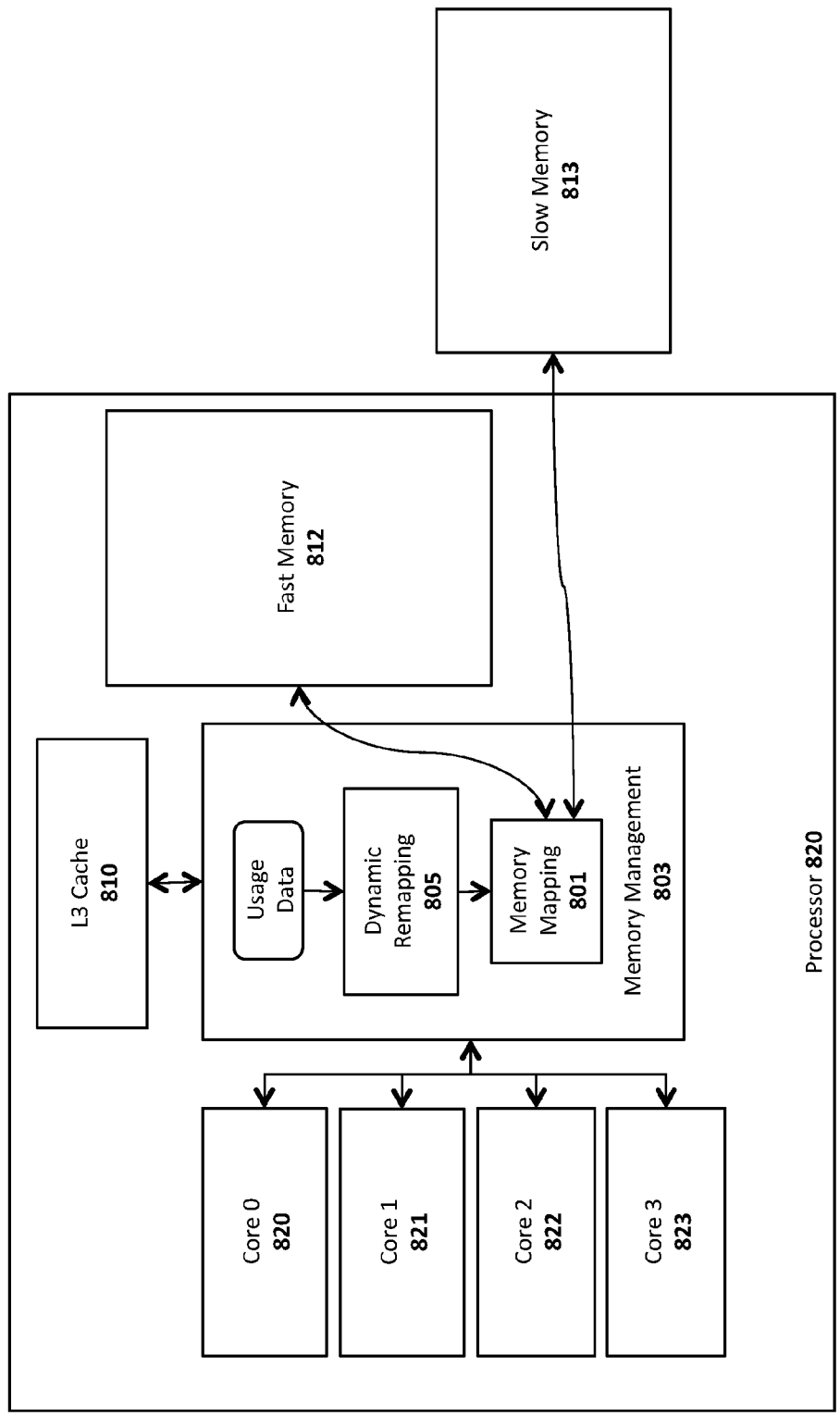
FIGS. 8A-C illustrate different embodiments of a heterogeneous memory system.

As illustrated in FIG. 8A, one embodiment of the invention is implemented within a processor 820 comprising a plurality of cores 820-823, a fast memory 812, a slow memory 813, and memory management logic 803 for managing the allocation of system memory space between the fast memory 812 and slow memory 813. In particular, in one embodiment, the memory management logic 803 includes memory mapping logic 801 which maps the entire system memory space across the two different memories 812-813 based on variables such as the rate at which portions of the memory space are accessed. In one embodiment, the memory mapping logic 801 accomplishes this by remapping the physical addresses generated using virtual-to-physical address translation to memory "chunks" within the fast memory 812 and slow memory 813. While in one embodiment, the memory "chunks" are 2 KB in size, the underlying principles of the invention are not limited to any particular chunk size. The relationship between chunk size and the size and complexity of the memory mapping logic 801 is discussed below.

In one embodiment, dynamic remapping logic 805 dynamically updates the mappings within the memory mapping logic 801 based, at least in part, on the frequency with which the different chunks of memory in fast memory 812 and slow memory 813 are accessed. For example, in one embodiment, if a particular chunk of memory space in slow memory 813 is being accessed at a significantly higher rate than a chunk of memory space in fast memory 812, then the dynamic remapping logic 805 may update the memory mapping logic 801 to remap the more frequently accessed chunk from slow memory to fast memory and the less frequently accessed chunk from fast memory to slow memory.

In addition to the fast memory 812 and slow memory 813, the memory subsystem of the illustrated processor 820 may also include a level 3 (L3) cache 810, one or more level 2 (L2) caches and one or more level 1 (L1) caches (not shown). In a typical implementation, the L2 and L1 caches are configured within each of the processor cores 802-805. While these details are provided for the sake of completeness, the underlying principles of the invention are not limited to any particular caching arrangement and, in fact, the use of caching is not required for complying with the underlying principles of the invention.

Figure 8B:
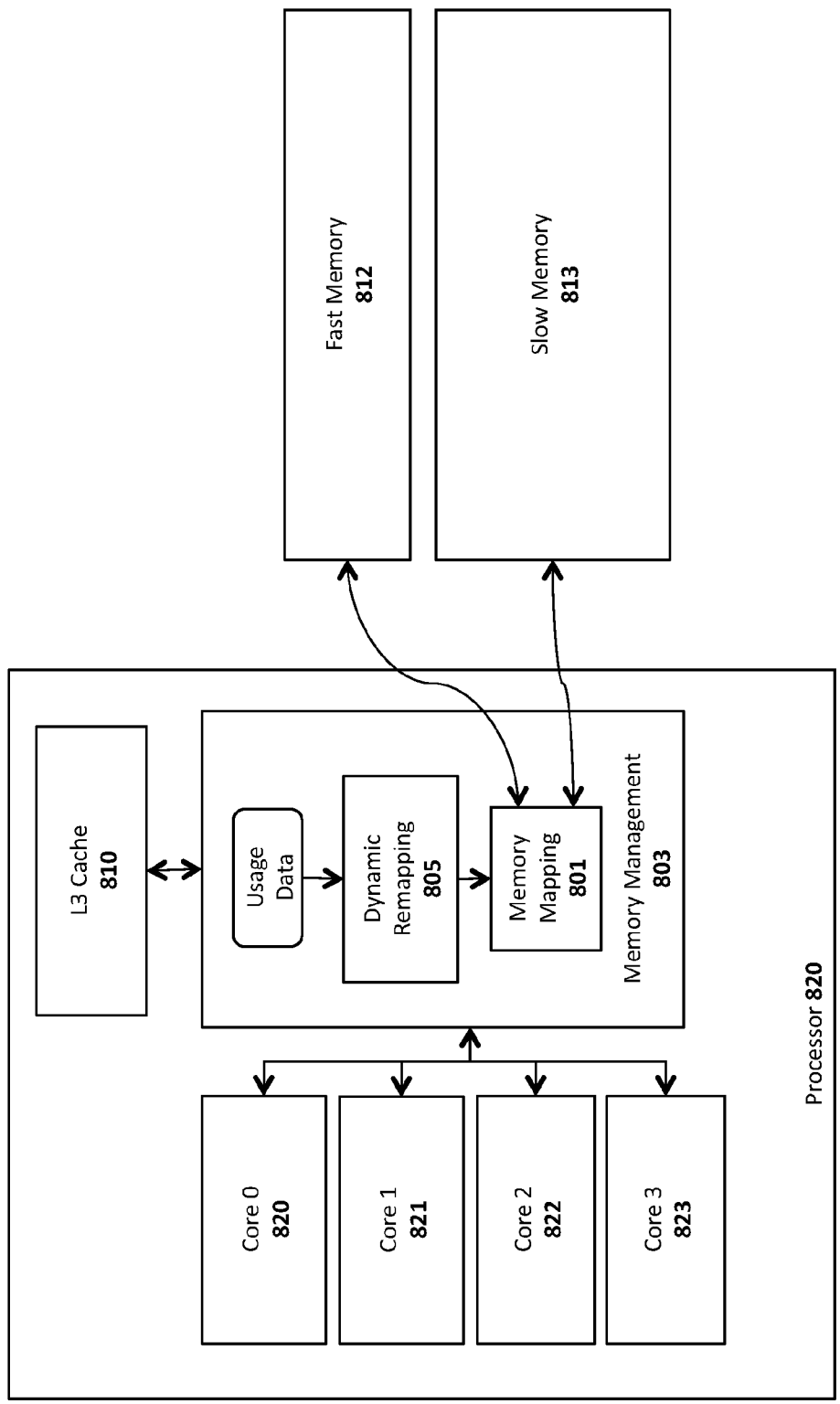
Figure 8C:
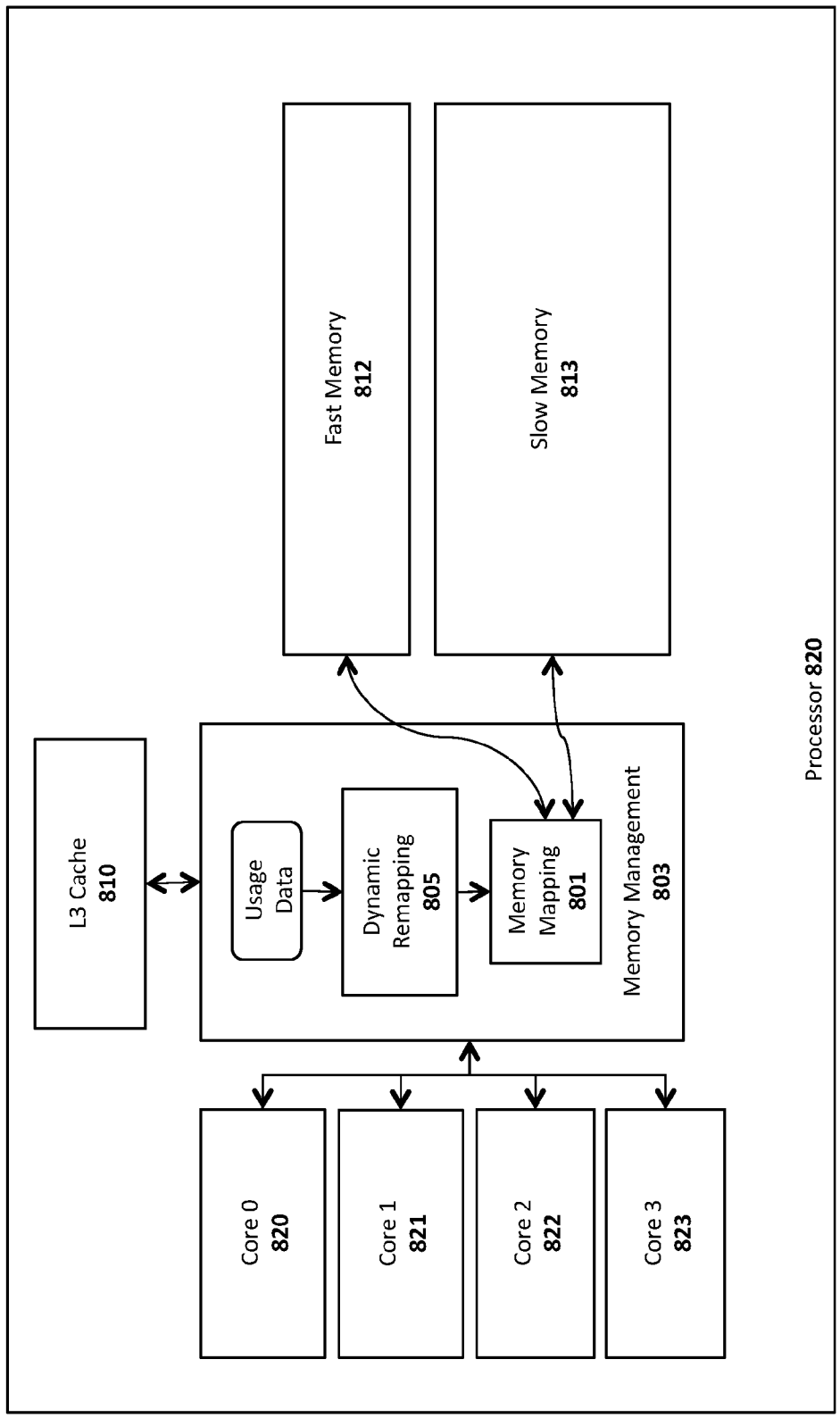

In the embodiment shown in FIG. 8A, the fast memory 812 is implemented on the same die as the processor 820 or as a die-stacked DRAM (e.g., as an Embedded DRAM or "eDRAM"). However, as illustrated in FIG. 8B, the underlying principles of the invention may also be implemented on systems in which both the fast memory 812 and slow memory 813 are off-die. Alternatively, in another embodiment shown in FIG. 8C, both the fast memory 812 and slow memory 813 are located on-die. In short, the underlying principles of the invention are not limited to any physical arrangement of the fast memory and slow memory.

Figure 9:
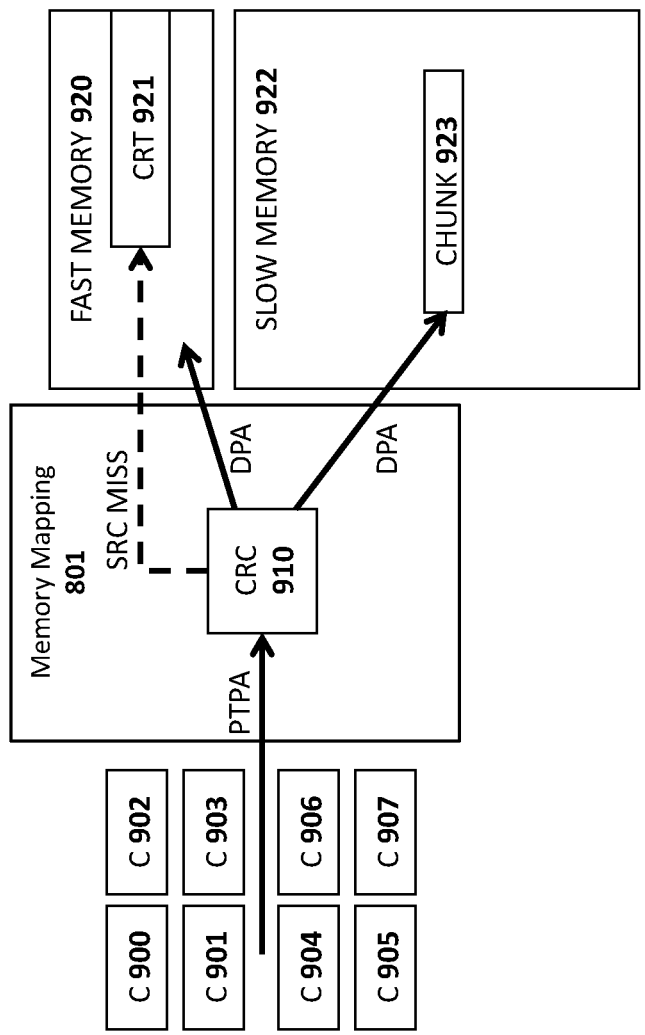
FIG. 9 illustrates one embodiment of a heterogeneous memory architecture including a chunk remapping cache and chunk remapping table.

In a conventional processor, a virtual address is translated to physical address retrieved from the page tables, i.e., a Page Table Physical Address (PTPA), which is then used to access DRAM. As mentioned above, one embodiment of the invention supports the ability to remap the PTPAs to support the transparent swapping of memory chunks between fast and slow memory. As illustrated in FIG. 9, in one embodiment, the PTPA, originating from one of a plurality of cores 900-907 is used to perform a lookup in a chunk remapping cache 910 which contains cached mappings between PTPA and a DRAM Physical Addresses (DPAs). In one embodiment, the chunk remapping cache 910 contains a subset of the complete PTPA-DPA mappings which are maintained in a chunk remapping table 921 stored in the fast memory 920.

If a particular mapping is present in the CRC 910, then the chunk is quickly identified via the lookup and the data contained in the chink is returned to the requesting core 900-907 (from the fast memory 920 or the slow memory 922, depending on where the chunk is currently located). If the mapping for the PTPA is not currently in the CRC 910, then an CRC miss signal is generated and the mapping entry is accessed from the CRT 921. Because an access to the CRT 921 takes more time than an access to the CRC 921, the CRT 921 may implement various cache management techniques to ensure that the entries which are most frequently needed are present in the CRC 921. In one embodiment, whenever an entry is accessed from the CRT 921, the entry is stored within the CRC 910. To make room for each new entry, the CRC 910 may evict an entry which has been accessed the least frequently.

Thus, the embodiment shown in FIG. 9 provides two-level indirection using the chunk remapping cache 910. Each request to either slow or fast memory begins with by looking for its remapping information in the CRC 910 and, if the CRC 910 does not contain appropriate remapping entry (CRC miss), then the memory mapping logic 801 retrieves the remapping entry from the CRT 921 located in fast memory 920 and allocates it in the CRC 910.

Figure 10:
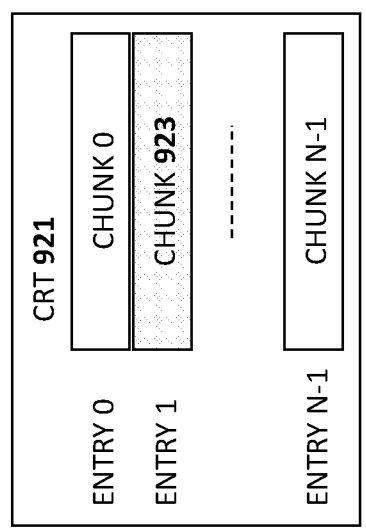
FIG. 10 illustrates one embodiment of a chunk remapping table comprising a plurality of entries.

At a minimum, a remapping entry needs to indicate which chunk is currently located in fast memory 920. For example, with 1 GB fast/4 GB slow memory and 2 KB chunks, the maximum number of chunks that fast memory can accommodate is 512K (out of 2560K chunks). In this embodiment, the minimum number of remapping entries required for the remapping table is 512K. It is worth noting that the size of the remapping table is bounded to the number of chunks in the fast memory, so the storage and latency overheads may still be high to use an on-chip SRAM structure for the remapping table. With the above remapping table design, when a chunk 923 that was originally allocated to slow memory 922 by the operating system is brought into one of the locations in fast memory 920, the corresponding remapping entry is modified to have new mapping information such as "Chunk 923" in Entry1 in FIG. 10. The implementation of one embodiment of the remapping table is discussed in more detail below.

The caching techniques discussed above may not be easily realized due to the huge penalty on a CRC miss which requires an access to fast memory 920 to retrieve the remapping information from the CRT 921. In the CRT design described, however, since the remapping information can be located anywhere (or nowhere) for a miss-invoked memory request, all the CRT entries located in the fast memory may need to be searched, potentially requiring thousands of memory requests to fast memory just for a single CRC miss.

Figure 11:
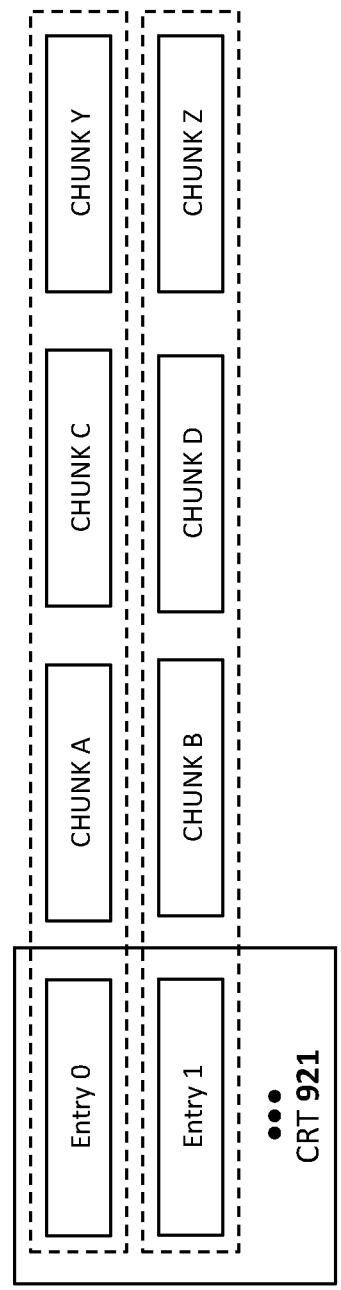
FIG. 11 illustrates chunk-restricted remapping employed in one embodiment of the invention.

One solution to restricting the CRC miss penalty within a single fast memory access is chunk-restricted remapping as shown in FIG. 11. In this embodiment, each entry in the remapping table owns some number of chunks, where the number may be determined by the total number of chunks over the number of CRT entries in the simplest case (e.g., # Chunks/#Entries=Chunks per entry). In the example shown in FIG. 11, each entry in the SRT 921 is assigned three chunks. Entry 0, for example, is assigned Chunks A, C, and Y and Entry 1 is assigned Chunks B, D, and Z. In operation, a chunk is restricted to swap only with the chunks that are owned by the same entry. For example, Chunks A, C and Y are only allowed to be mapped to the chunks in fast memory 920 and slow memory 922 owned by Entry 0, while chunks B, D and Z are allowed to be mapped only to the chunks in fast memory 920 and slow memory 922 owned by Entry 1. In this embodiment, because the information for Chunk A is only maintained in Entry 0, even if the remapping information for Chunk A is not found in the CRC 910, it can be retrieved with a single access. In one embodiment, to determine the CRT entry to which a chunk is mapped, a few bits from the page table physical address (PTPA) are used, depending on the ratio of fast and slow memory sizes. For a 1:4 ratio, for example, each of the four chunks in slow memory and one corresponding chunk in fast memory are assigned to the same CRT entry, so three bits are needed to identify the CRT entry. Of course, the underlying principles of the invention are not limited to any particular ratio of fast and slow memory or any particular number of bits used to locate CRT entries.

Figure 12A:
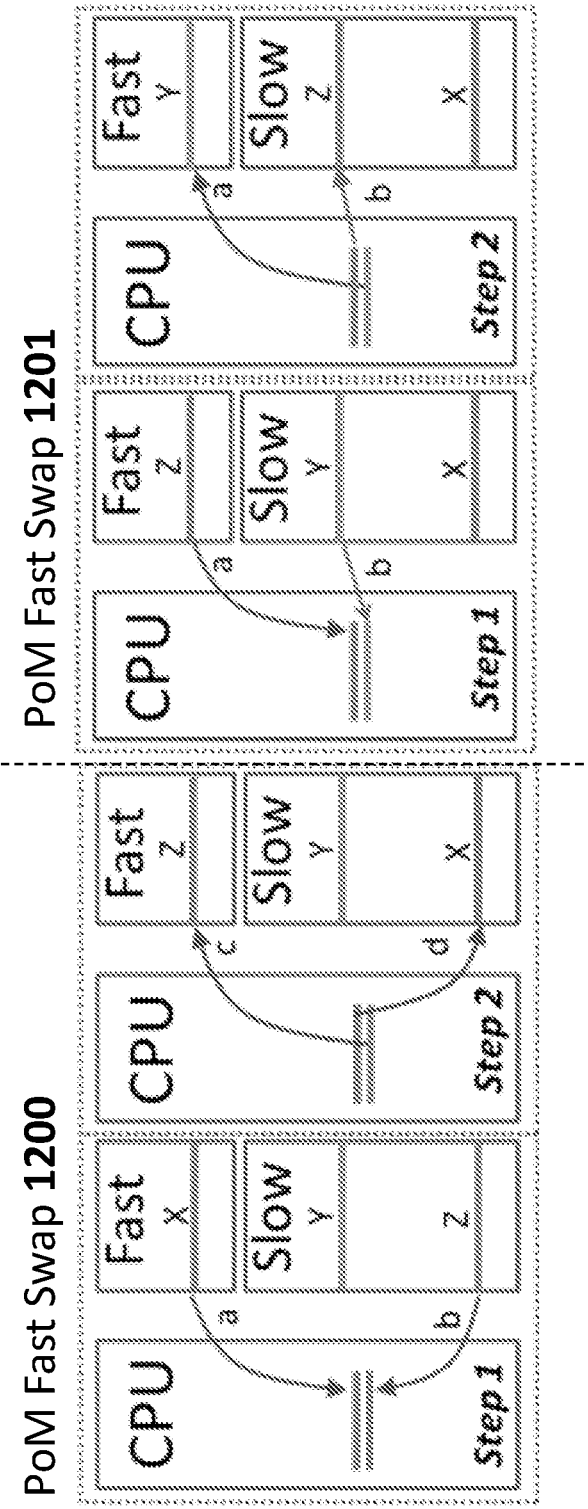
FIGS. 12A-B illustrate fast swap and slow swap operations for swapping chunks between fast and slow memory.

In contrast to traditional cache allocation, the PoM architectures described herein make all of both fast and slow memory available to running software. To prevent duplicates and to ensure that all data is preserved as data is moved back and forth between fast and slow memory, one embodiment of the invention replaces the traditional cache allocation with a chunk swap operation. As illustrated in FIG. 12A, the chunk swap operation may differ depending on the contents of the chunk displaced from fast memory. The PoM swap operation shown on the left, PoM Fast Swap 1200, occurs when the displaced chunk (X) was originally allocated by the operating system to fast memory. In this case, a request to chunk Z in slow memory requires chunks X and Z to be read simultaneously (a, b) from fast and slow memory into on-chip buffers. The swap completes after copying Z from the on-chip buffer to fast memory and copying X from the buffer to slow memory.

As different chunks from slow memory are swapped into fast memory, the straightforward swap operation illustrated as PoM Fast Swap 1200 will result in chunks migrating to different locations in slow memory, as illustrated in PoM Fast Swap 1201. After swapping chunks X and Z (as shown in Fast Swap 1200), a request to chunk Y causes a second swap. The second swap simply swaps chunk Y with chunk Z, resulting in chunk Z assuming the position in slow memory that was originally allocated to chunk Y. The embodiments of the invention rely on the chunk remapping table 921 for tracking chunks as they are moved back and forth between slow and fast memory. However, chunk motion between the different locations in slow memory as illustrated in FIG. 12A implies that the remapping table must not only identify the current contents of fast memory, but must also track the current location of all chunks in slow memory. Note that recording only the chunk number brought into fast memory, as the remapping entry shown in FIG. 10, may be insufficient to allow this fast swap operation. The ability to support chunk motion throughout slow memory adds complexity to the remapping table, but significantly simplifies the swapping operation.

Figure 12B:
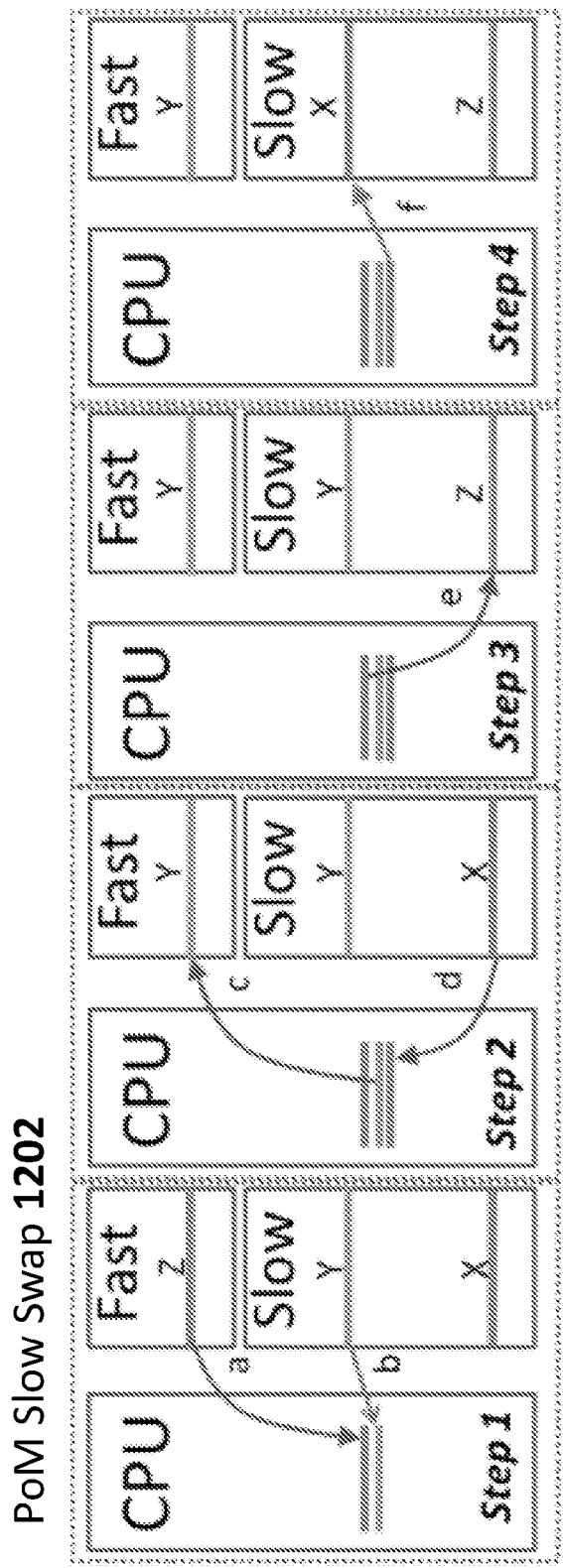

An alternative approach to remapping requires chunks to always return to their original position in slow memory. In this approach, the positions of all chunks in slow memory can be inferred from their page table physical addresses (PTPAs), with the exception of chunks currently mapped to fast memory. To ensure this, a second swapping technique may be employed as shown in FIG. 12B, PoM Slow Swap 1202. As in swap 1201 of FIG. 12A, a request to chunk Y causes a swap with chunk Z, currently in fast memory. In this case, however, rather than performing a simple swap between Z and Y, Z is restored to its original position in slow memory, currently occupied by X. This is accomplished in four steps: (1) fetching Z and Y simultaneously (a, b); (2) writing Y to fast memory and simultaneously fetch X from slow memory; (3) freeing X's location then writing Z back to its original location; (4) writing X to Y's previous location in slow memory. The slow PoM swap 1202 generally requires twice as much time as the fast PoM swap with each of the four steps requiring the transfer of a chunk either to or from slow memory.

The choice between slow and fast swap types also drives the number of entries the remapping table requires. The PoM slow swap ensures that all data stored in slow memory is stored at its original location as indicated by its page table physical address. As a result, the CRT 921 may only include remapping for the chunks in fast memory. Conversely, PoM fast swap allows data to migrate throughout slow memory; as a result, the CRT 921 must indicate the location of each chunk in slow memory. To illustrate this, consider a system consisting of 1 GB of fast memory and 4 GB of slow memory divided up into 2 KB chunks. This system would require a remapping table with the ability to map 512K (i.e., 1 GB/2K) chunks if it implemented slow swaps and 2048K chunks if it fast swaps (4 GB/2K) were supported. The discussion below will assume a remapping table architecture designed to support fast swap.

In a 1 GB fast memory and 4 GB slow memory organization, a total of five possible chunks compete for a single location in fast memory, and the other chunks will reside in one of the four locations available in slow memory. The remapping table must record which of the five possible chunks currently resides in each of five possible locations.

Figure 13:
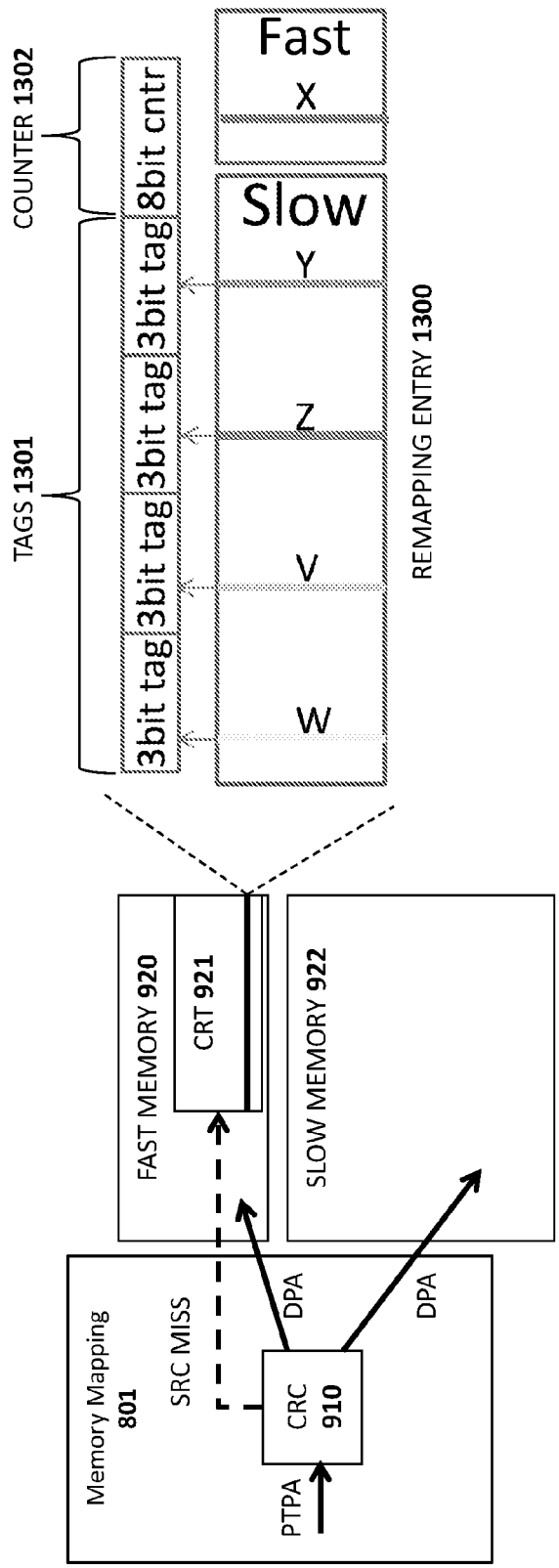
FIG. 13 illustrates details for one embodiment of a remapping entry.

FIG. 13 illustrates the organization of an exemplary remapping entry 1300 in the remapping table 921 with the five chunks, V, W, X, Y and Z competing for a single location in fast memory. Each remapping entry in the remapping table contains tags 1301 for 4 of the 5 chunks; the contents of the fifth chunk can be inferred from that of other chunks. In addition to the four 3-bit tags, the mapping table contains a shared 8-bit counter 1302 used to determine when swapping should occur (embodiments of which are described below). Co-locating the tags for the conflicting chunks has two advantages. First, since all swaps are performed between existing chunks, this organization facilitates updates associated with the swap operation. Second, it facilitates the usage of the shared counter 1302 that measures the relative usage characteristics of the different chunks competing for allocation in fast memory.

The chunk remapping cache 910 must be designed with two conflict objectives in mind. On the one hand, a desire to minimize misses provides an incentive to increase capacity and associativity. On the other hand, increasing capacity can increase access latency which negatively impacts the performance of both hits and misses. To strike this balance, one embodiment of the invention employs a 32 KB remapping cache with limited (4-way) associativity. In one embodiment, on a remapping cache miss, limited spatial locality is captured by fetching both of the requested remapping entry and the second remapping entry that cover an aligned 4 KB region. Certain memory access protocols (e.g., Double Data Rate 3 (DDR3) or similar protocols), the fast memory 920 may deliver 64B blocks of data or more per access. Although a single 64B block would include tens of remapping entries, it has been determined that CRC pollution introduced by allocating such a large number of remapping entries outweighs the potential spatial locality. Since 4 KB OS pages were modeled, any spatial locality that existed beyond a 4 KB region in the virtual address space could potentially have been destroyed after translation to the physical address space. Note also that a CRC hit for a given memory request does not guarantee that the requested data is found in fast memory.

As discussed above, a conventional tracking/replacement mechanism may not be suitable for a hardware-managed PoM architecture, and a tracking mechanism for a hardware-managed PoM needs to respond quickly with low storage overhead (e.g., a small number of counters, fewer bits per counter). The tracking/decision mechanism employed in one embodiment of the invention is discussed below.

In one embodiment, to make a chunk allocation/de-allocation decision, the counter values of all involved chunks collected at a decision point are compared (e.g., sorting). The relevant information is in fact the one relative to each other rather than the absolute access counts to each chunk. For example, assume only one slot exists in fast memory with both chunks A and Z competing for it, which is currently taken by chunk Z. To decide which chunk should reside in fast memory, a counter is associated with a chunk in fast memory (chunk Z) and another chunk in slow memory (chunk A). During an application run, the associated counter is decremented on an access to chunk Z and incremented on an access to chunk A. Using this competing counter (CC), it is a straightforward process to determine which of the two chunks has been accessed more during a certain period based on the counter value, which would be useful when making swap decisions. For example, more accesses to Z would result in a lower counter value and more accesses to A would result in a higher counter value.

Figure 14A:
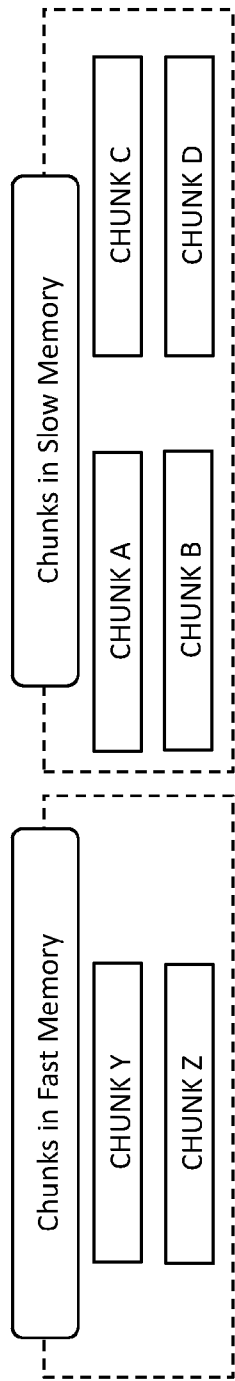
FIGS. 14A-D illustrate different embodiments for implementing a competing counter.
Figure 14B:
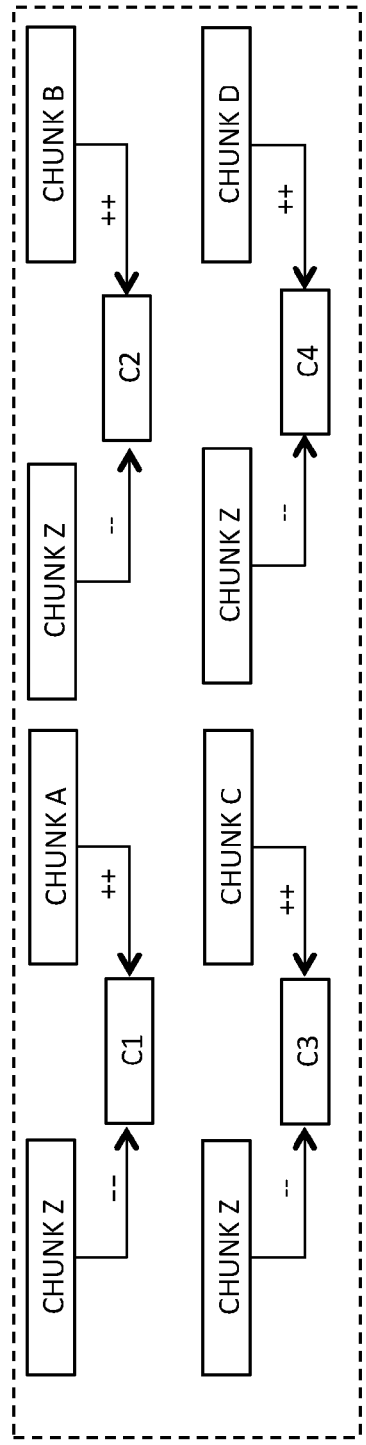

FIG. 14A illustrates a general case in which multiple slots exist in fast memory, while a number of chunks are competing for the slots. The competing counter approach seems to incur high overhead since the competing counters need to be allocated to all combinations of chunks in fast and slow memory, if chunks are allowed to be mapped into any location in fast memory. FIG. 14B illustrates the four counters required just for chunk Z (C1, C2, C3, C4) due to space constraints.

Figure 14C:
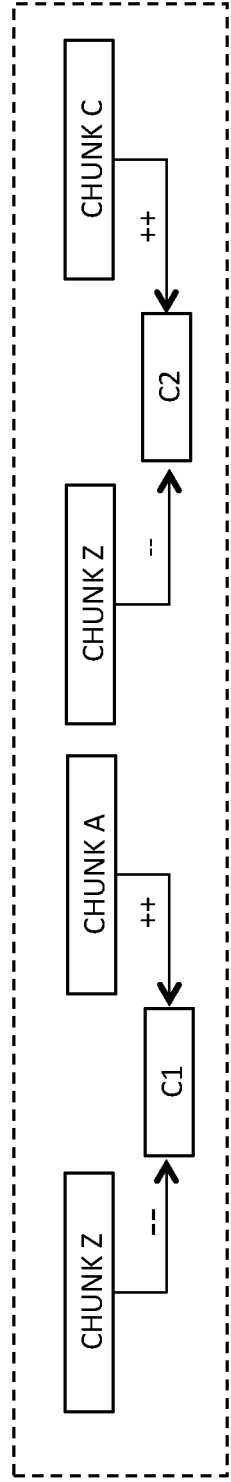
Figure 14D:
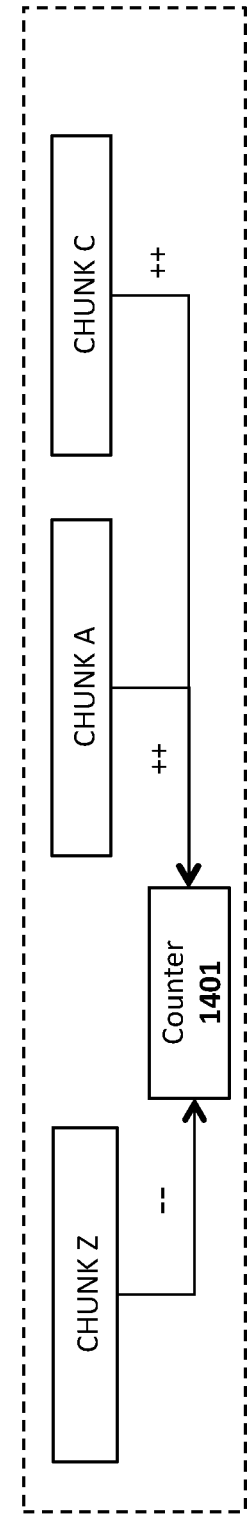

However, thanks to the chunk-restricted remapping described above, the number of competing counters required is in fact bounded to the number of chunks in slow memory as illustrated in FIG. 14C. In this example, chunk Z and chunk A share a competing counter C1 and chunk Z and chunk C share a competing counter C2. Although this already reduces the storage overhead while providing more responsiveness, the storage overhead can further be reduced by sharing a single counter 1401 between competing chunks as illustrated in FIG. 18D. This reduces the number of counters to a single counter for each chunk in fast memory.

Sharing the competing counters between competing chunks provides at least two benefits. First, it reduces the overall memory capacity required by the chunk remapping table. Second, and more importantly, it reduces the size of each CRC entry by a little more than 50%, allowing capacity to be effectively doubled. Furthermore, sharing counters between competing chunks seems to have little to no effect on the performance of the replacement algorithm. Theoretically, references to chunk A could have incremented the shared counter just below a threshold, and chunk C could cause the counter to reach the allocation threshold and is chosen for allocation. In practice, however, this occurrence is rare since the usage of different chunks in a competing chunk tends to be highly asymmetric. Even though this rare case could occur, it is likely to have a temporary effect, and the highly-referenced chunk would end up residing in fast memory shortly afterwards.

In one embodiment, swapping occurs when the counter value is greater than a threshold, which implies that the chunk currently residing in fast memory may not be the best one. For example in FIG. 12D, an LLC miss request targeting chunk A increments its associated counter. At this point, if the resulting counter value is greater than a threshold, chunks A and Z will be swapped and their associated counter will reset. An optimal threshold value may be selected depending on the application due to the different nature of memory access patterns.

To determine a suitable swapping rate for different applications, one embodiment of the memory management logic 803 samples memory regions. The locations in fast memory may be grouped into 32 distinct regions in an interleaving fashion, and four regions are dedicated to sampling, while the other 28 regions follow the decision from sampling. The chunks in the sampling regions modify the remapping table/cache when their counter values are greater than the assigned thresholds, but the actual swapping is not performed for the chunks restricted to the sampling region. In order to drive the suitable swapping rate, the following information may be collected for each sampling region:

$N_{static}$: # of memory requests serviced from fast memory with static mapping;

$N_{dynamic}$: # of memory requests expected to be serviced from fast memory when swapping is allowed with a given threshold; and $N_{swap}$: # of expected swaps for a given threshold.

For each of four sampling regions, the expected benefit ($B_{expected}$) is computed using $B_{expected} = (N_{dynamic} - N_{static}) + K \times N_{swap}$ and the threshold used in the sampling region is chosen that provides the highest non-negative $B_{expected}$ value at every 10K LLC misses. In the case where such $B_{expected}$ does not exist (i.e., all negative), the following regions do not perform any swapping operations.

In the above-described embodiment, K is the number of extra hits on the swapped-in chunk higher than hits on the swapped-out chunk to compensate the cost of a single swap. K differs depending on the fast and slow memory latency in a heterogeneous memory system. In one embodiment which has been tested, the cost of a single fast swap is about 1.2K cycles, and the difference in access latency between fast and slow memories is 72 cycles. Thus, in general, the swapped-in chunk needs to have at least 17 more (future) hits than the swapped-out chunks for swapping to be valuable. In one embodiment, the value of K is computed in hardware at boot time. Note that the memory management logic 803 must be provided with the timing parameters in both fast and slow memory. In one embodiment, 1, 6, 18, and 48 is used for the thresholds in four sampling regions and a value of K=20 is used. Of course, these are merely illustrative examples. The underlying principles of the invention are not limited to any particular set of thresholds or other values.

FIG. 15 illustrates one embodiment of a method for accessing and remapping chunks. At 1101 a memory request is received including a page table physical address. At 1102 a cache lookup is performed to determine whether an entry associated with the PTPA is stored in the chunk remapping cache (CRC). If so, then the DRAM physical address (DPA) of the memory chunk is identified and the chunk is read from either fast or slow memory (depending on its current location). If an entry is not found on the CRC, then at 1108, the memory chunk DPA is identified from the CRT (e.g., via an access to fast memory as discussed above). At 1109 the CRT entry may be stored within the CRC based on the cache management policy being implemented.

At 1104, one or more competing counters are updated to indicate the relative frequency with which chunks are being accessed. As mentioned above, with chunk-restricted remapping (see FIG. 11) a single counter may be used to track the relative number of accesses for a set of chunks. At 1105, a determination is made as to whether a chunk swap is required. As mentioned, if the value of the competing counter reaches a specified maximum or minimum threshold, then this may indicate that a chunk in slow memory is being accessed more frequently than a chunk in fast memory, necessitating a swap. If a chunk swap is required, then it is performed at 1106. If not, then the current chunk mappings are maintained at 1107.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. A processor comprising:
    memory mapping circuitry to map a first type of memory and a second type of memory as a single physical address space comprising a plurality of memory chunks, the first type of memory having a first set of memory access characteristics and the second type of memory having a second set of memory access characteristics different from the first set of memory access characteristics; and
    dynamic remapping circuitry to
        dynamically update the memory mapping circuitry to cause one or more memory chunks to be swapped between the first and second types of memory based, at least in part, on a detected frequency with which the memory chunks are accessed; and
        perform chunk-restricted remapping in which a particular chunk is only permitted to be stored in one or more specific regions within the first type of memory and one or more specific regions in the second type of memory.

2. The processor as in claim 1 wherein the first set of memory access characteristics comprise higher performance characteristics than the second set of memory access characteristics and wherein the dynamic remapping circuitry is to allocate memory chunks to the first memory which are accessed relatively more frequently than the memory chunks allocated the second memory.

3. The processor as in claim 2 wherein the first and second sets of memory access characteristics include a memory access latency value.

4. The processor as in claim 2 wherein the first and second sets of memory access characteristics include a memory access bandwidth.

5. The processor as in claim 1 wherein the first memory and the second memory are both dynamic random access (DRAM) memory.

6. The processor as in claim 1 wherein the first memory is on a common die with the processor and the second memory is off-die.

7. The processor as in claim 1 wherein each memory chunk comprises a 2 KB region of memory.

8. The processor as in claim 1, wherein each memory chunk is associated with a corresponding counter to track the frequency at which each memory chunk is being accessed.

9. The processor as in claim 1 wherein the memory mapping circuitry comprises a chunk remapping table (CRT), wherein each entry in the CRT is to specify one or more regions within the fast memory and one or more regions in the slow memory.

10. The processor as in claim 9 wherein the memory mapping circuitry comprises a chunk remapping cache for caching frequently accessed chunk mappings.

11. The processor as in claim 10 further comprising:
    at least one competing counter to be incremented when a first memory chunk within an entry is accessed and to be decremented when a second chunk within the entry is accessed, wherein the dynamic remapping circuitry determines whether to swap the first chunk with the second chunk based on a current value of the competing counter.

12. A method comprising:
    mapping a first type of memory and a second type of memory as a single physical address space comprising a plurality of memory chunks, the first type of memory having a first set of memory access characteristics and the second type of memory having a second set of memory access characteristics different from the first set of memory access characteristics; and
    dynamically updating a memory mapping to cause one or more memory chunks to be swapped between the first and second types of memory based, at least in part, on a detected frequency with which the memory chunks are accessed; and
    performing chunk-restricted remapping in which a particular chunk is only permitted to be stored in one or more specific regions within the first type of memory and one or more specific regions in the second type of memory.

13. The method as in claim 12 wherein the first set of memory access characteristics comprise higher performance characteristics than the second set of memory access characteristics and wherein the dynamic remapping is performed to allocate memory chunks to the first memory which are accessed relatively more frequently than the memory chunks allocated the second memory.

14. The method as in claim 13 wherein the first and second sets of memory access characteristics include a memory access latency value.

15. The method as in claim 13 wherein the first and second sets of memory access characteristics include a memory access bandwidth.

16. The method as in claim 12 wherein the first memory and the second memory are both dynamic random access (DRAM) memory.

17. The method as in claim 12 wherein the first memory is on a common die with the processor and the second memory is off-die.

18. The method as in claim 12 wherein each memory chunk comprises a 2 KB region of memory.

19. The method as in claim 12 wherein each memory chunk is associated with a corresponding counter to track the frequency at which each memory chunk is being accessed.

* * * * *